US007814398B2

United States Patent
Djurdjevic et al.

(10) Patent No.: US 7,814,398 B2
(45) Date of Patent: Oct. 12, 2010

(54) COMMUNICATION CHANNEL WITH REED-SOLOMON ENCODING AND SINGLE PARITY CHECK

(75) Inventors: Ivana Djurdjevic, San Jose, CA (US); Erozan Mehmet Kurtas, Pittsburgh, PA (US); Cenk Argon, Madison, WI (US)

(73) Assignee: Seagate Technology LLC, Scotts Valley, CA (US)

( * ) Notice: Subject to any disclaimer, the term of this patent is extended or adjusted under 35 U.S.C. 154(b) by 1152 days.

(21) Appl. No.: 11/450,317

(22) Filed: Jun. 9, 2006

(65) Prior Publication Data

US 2007/0288833 A1    Dec. 13, 2007

(51) Int. Cl.
*H03M 13/00*    (2006.01)
(52) U.S. Cl. .................... 714/784; 714/756; 714/801
(58) Field of Classification Search ................. 714/784, 714/756, 801, 780, 752; 341/58
See application file for complete search history.

(56) References Cited

U.S. PATENT DOCUMENTS

| | | | | |
|---|---|---|---|---|
| 5,559,778 | A * | 9/1996 | Inokuchi et al. ......... | 369/53.24 |
| 6,195,396 | B1 | 2/2001 | Fang et al. .............. | 375/261 |
| 6,553,533 | B2 | 4/2003 | Demura et al. ........... | 714/769 |
| 6,694,476 | B1 | 2/2004 | Sridharan et al. ........ | 714/781 |
| 6,917,313 | B1 * | 7/2005 | Burd et al. .............. | 341/58 |
| 7,444,582 | B1 * | 10/2008 | Au et al. ................ | 714/784 |
| 2002/0188906 | A1 | 12/2002 | Kurtas et al. ............ | 714/755 |
| 2003/0051201 | A1 | 3/2003 | Brenna .................. | 714/763 |
| 2003/0097632 | A1 | 5/2003 | Marconetti .............. | 714/784 |
| 2003/0192007 | A1 | 10/2003 | Miller et al. ............ | 714/782 |
| 2004/0059990 | A1 | 3/2004 | Fredrickson et al. ...... | 714/785 |
| 2004/0064777 | A1 | 4/2004 | Kurtas et al. ........... | 714/752 |
| 2004/0064779 | A1 | 4/2004 | Vasic et al. ............ | 714/758 |
| 2004/0194002 | A1 | 9/2004 | Zhang .................. | 714/784 |
| 2005/0033791 | A1 | 2/2005 | Pollock ................. | 708/530 |
| 2005/0102605 | A1 | 5/2005 | Gupta .................. | 714/776 |
| 2005/0138522 | A1 | 6/2005 | Silvus ................... | 714/758 |
| 2005/0149832 | A1 | 7/2005 | Liberol et al. ........... | 714/781 |
| 2005/0172208 | A1 * | 8/2005 | Yoon .................... | 714/784 |
| 2005/0229091 | A1 | 10/2005 | Narayanan et al. ........ | 714/801 |
| 2005/0278610 | A1 | 12/2005 | Banks ................... | 714/784 |
| 2007/0192666 | A1 * | 8/2007 | Song et al. .............. | 714/780 |

FOREIGN PATENT DOCUMENTS

EP    1 524 771 A1    4/2005

OTHER PUBLICATIONS

Search Report and Written Opinion by the Austrian Patent Office in foreign application 200703940-7, filed May 30, 2007.

* cited by examiner

*Primary Examiner*—Fritz Alphonse
(74) *Attorney, Agent, or Firm*—David C. Bohn; Westman, Champlin & Kelly, P.A.

(57) ABSTRACT

A communication channel including Reed-Solomon (RS) and single-parity-check (SPC) encoding/decoding. Multiple RS codewords are combined and then SPC encoded into an RS/SPC array. A soft-input soft-output (SISO) channel detector detects the RS/SPC encoded bits and provides soft (reliability) information on these bits. A combined RS and SPC error correction block provides a recovered user output. An iterative soft input decoding algorithm combines RS and SPC error correction.

20 Claims, 15 Drawing Sheets

COMMUNICATION CHANNEL WITH REED-SOLOMON ENCODING AND SINGLE PARITY CHECK

FIELD OF THE INVENTION

The present invention relates generally to communication channels that include Reed-Solomon encoding, and more particularly but not by limitation to read/write channels in data storage devices that include Reed-Solomon encoding.

BACKGROUND OF THE INVENTION

Reed-Solomon (RS) codes are a very powerful class of error correction codes (ECC) useful for channel encoding and decoding in data storage devices. The performance of RS codes represents one of the key determinants of system reliability. With increased areal density on one hand, and increased requirements for low error rates on the other hand, there is a demand for encoding and decoding circuits and methods that can provide a combination of low error rates, high speed and improved system reliability. Increasing ECC overhead reduces error rates and makes the system more reliable, however the increased overhead due to redundancy reduces storage capacity and reduces speed.

To achieve better reliability, RS code length and symbol size can be increased, but this increased reliability comes at a price of increased decoding complexity, which can limit speed unacceptably.

Embodiments of the present invention provide solutions to these and other problems, and offer other advantages over the prior art.

SUMMARY OF THE INVENTION

Disclosed is a method and a communication channel that comprises a Reed-Solomon/single parity check encoder. The Reed Solomon/single parity check encoder receives user words and generates an encoded block. The encoded block includes single parity check code and Reed-Solomon code words that each comprise more than one user word.

The communication channel comprises a soft input soft output detector receiving the encoded block. The soft input soft output detector provides a detector hard output and a detector soft levels.

The communication channel comprises a Reed-Solomon/single parity check (RS/SPC) decoder. The Reed-Solomon/single parity check decoder receives the hard output and the soft levels. The detector generates recovered user words.

Other features and benefits that characterize embodiments of the present invention will be apparent upon reading the following detailed description and review of the associated drawings.

DETAILED DESCRIPTION OF ILLUSTRATIVE EMBODIMENTS

In the embodiments described below, a channel is disclosed in which RS decoder failure, or word failure rate is improved, without increasing RS code length or symbol size. The magnetic recording read/write system is modeled as a communication channel, where data is stored on a disc and read out at a later time. An array and a decoding algorithm are used for error correction. The array comprises an RS/SPC two dimensional array that comprises Reed-Solomon code words with an extra row of single parity check (SPC) bits formed on every column. An iterative decoding algorithm can comprise hard decision decoding for Reed-Solomon code and maximum a posteriori (MAP) decoding for an SPC code. Conventional error only RS decoding can be replaced with error and erasure RS decoding.

Figure 1A:
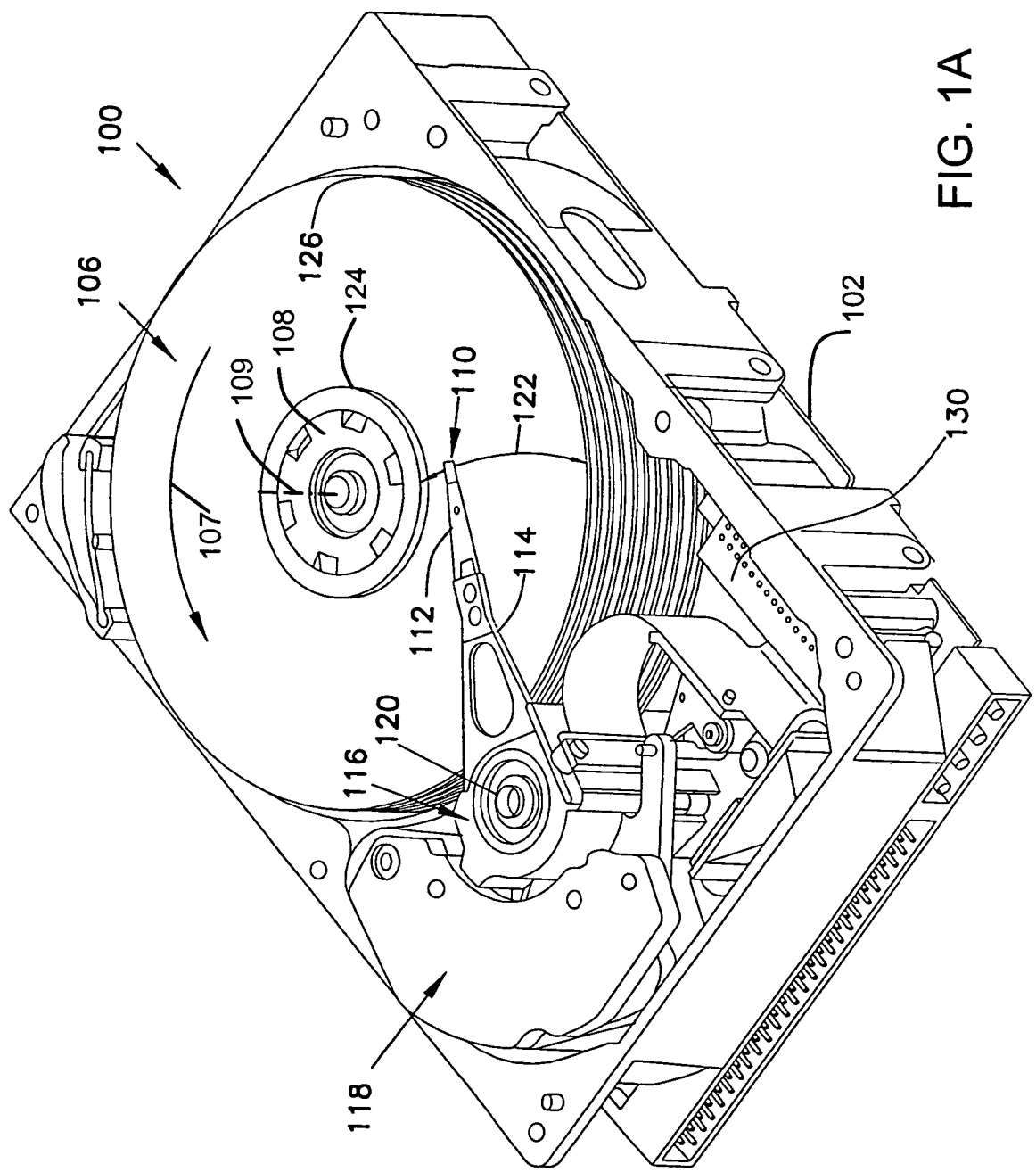
FIG. 1A illustrates an oblique view of a disc drive.

FIG. 1A is an isometric view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown).

Figure 1B:
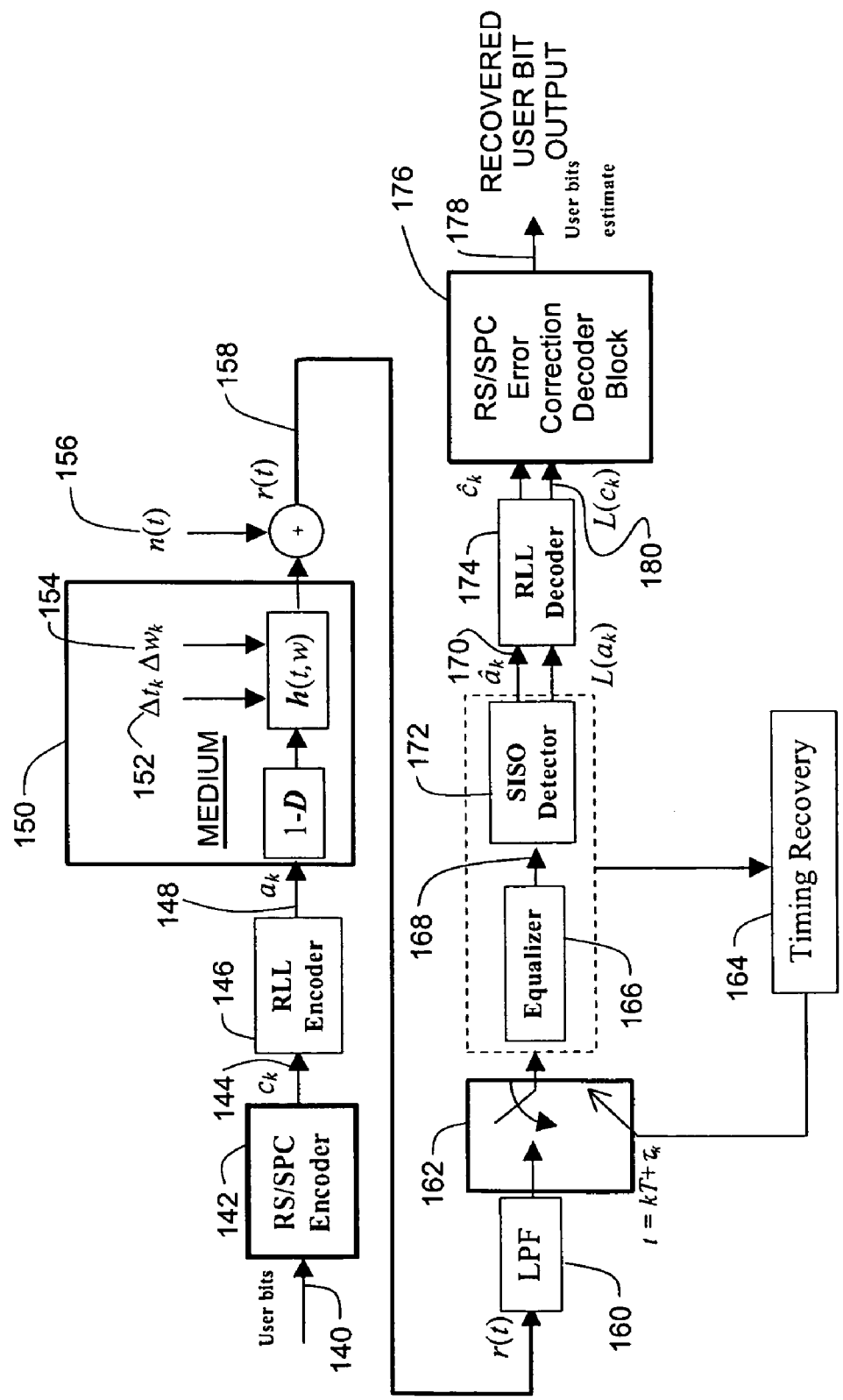
FIG. 1B illustrates an exemplary embodiment of a magnetic recording system.

A typical magnetic recording system model is depicted in FIG. 1B. User data bits 140 are encoded using RS/SPC encoder 142. The RS/SPC encoder 142 provides an 2-dimensional (or N-dimensional) array (RS/SPC code bits 144) that includes RS codewords combined with SPC codewords. After that, RS/SPC code bits 144 are encoded using Run-Length Limited (RLL) encoder 146. An obtained sequence $\{a_k\}$ at 148 is recorded on the storage medium 150 by magnetizing bits of the storage medium 150 into two opposite directions, one representing a logical 0 and the other representing a logical 1.

During a process of reading the bits, a read/write head produces an output pulse when there is a change in magnetization between sequential magnetized bits. The output pulse produced by the change in a magnetization flux caused by a positive transition in input bit sequence $\{a_k\}$ (from 0 to 1) is called transition response h(t, w). Consequently, a negative transition in the input bit sequence $\{a_k\}$ produces output −h(t, w). As expected, the transition response h(·) is a function of time t, but it is also a function of a parameter w, which represents the width of the transition pulse at a half of its peak value. The width parameter w is denoted as $PW_{50}$.

The signal read by the read/write head is corrupted by different types of noise. Media noise is due to the imperfections in magnetic media, the recording head, and other parts of the recording system. Here the media noise model is characterized by the position jitter $\Delta t_k$ at 152 and the pulse broadening effect $\Delta w_k$ at 154. Due to media noise, the transition response at the k-th bit interval is $h(t-\Delta t_k, w+\Delta w_k)$. Also present in the system is electronics noise, n(t) at 156, which is modeled as Additive White Gaussian Noise (AWGN). Finally, the transition response lasts more then one bit interval. Thus, there is an overlap of the transition responses corresponding to adjacent transitions. This type of noise is called Inter-Symbol Interference (ISI).

Noisy readback signal r(t) at 158 is passed through a Low-Pass Filter (LPF) at 160, and sampled at a baud-rate by sampling switch 162. Sampling instances $kT+\tau_k$ of the sampling switch 162 are determined by a timing recovery block 164.

The timing recovery block 164 compensates for any frequency and phase offsets between the read and the write clocking rates. To remove ISI, Partial Response Maximum Likelihood (PRML) detection is performed, preferably using a Viterbi algorithm, which is the optimal algorithm for sequence detection in systems with memory. However, memory of the magnetic recording channel is commonly very large, since one transition response spreads over many neighboring bit intervals, and applying the Viterbi algorithm would be very complex. For this reason, equalization is performed by equalizer 166, and the channel response is shaped to some predetermined target with smaller memory. With equalization, sequence detection of relatively small complexity can be performed on the equalized signal 168. An estimate $\{\hat{a}_k\}$ at 170 of bits $\{a_k\}$ is provided by a detector 172. The detector 172 comprises a soft input soft output (SISO) detector. Detector 172 can comprise a soft output Viterbi Algorithm (SOVA), BCJR or MAP algorithm variants, alone or in combination with either a SOVA decoder or an iterative decoder. Estimated sequence $\{\hat{a}_k\}$ at 170 is decoded using an RLL decoder 174 and an RS/SPC decoder 176 to obtain estimated user data bits (also called recovered user bits) at 178. The RS/SPC decoder 176 decodes an RS/SPC array that was originally generated by RS/SPC encoder 142, but which can include transmission errors. The RS/SPC decoder 176 includes a Reed-Solomon decoder and a MAP decoder for SPC code. The RS/SPC decoder 176 can be an error-only decoder, or it can also include an error/erasure decoder. The Reed-Solomon decoder includes Chien's search algorithm and Forney's algorithm.

Due to error propagation in the RLL decoder 174, a reverse scheme can also be used, with RLL encoder 146 applied prior to RS/SPC encoder 142. There is a desire to provide a lower bit error rate at the input of RS decoder 176. An iterative channel detector provides a lower bit error rate. The iterative detector comprises a Soft Input Soft Output (SISO) detector, e.g. BCJR detector or Soft Output Viterbi Algorithm (SOVA), and iterative decoder, e.g. message passing decoder. The iterative detector is commonly noise predictive. The best candidates for iterative codes are Turbo Product Code/Single Parity Check (TPC/SPC) codes and Low Density Parity Check (LDPC) codes. The introduction of SISO detectors and iterative codes into the read channel architecture provides availability of soft bit level information $L(c_k)$ 180 to the outer RS decoder 176.

Computer simulation indicates that if more RS codewords are somehow related to one another, knowledge about RS codewords that are correctly decoded can help in recovering other RS codewords that are thought to be undecodable. The probability of RS codeword decoding failure, Word Failure Rate (WFR), can improve more then one decade, in some cases even several decades, at a very low SNR. The relationship information together with providing available soft information 180 to the RS decoder 176, leads to arrays comprising RS codewords 1o and Single Parity Check (SPC) bits, or RS/SPC arrays. A decoding method for an RS/SPC array, described below, iteratively performs hard decision decoding of a powerful RS code and soft information update of SPC code bits. A large number of conventionally undecodable RS codewords within the array can be recovered in only several iterations. Furthermore, additional improvements of the WFR performance can be achieved if erasure and error RS decoding is used instead of error-only RS decoding. The soft information 180 obtained from SPC bits can help in determining which RS code symbols should be regarded as erasures.

RS/SPC Product Code

Figure 2:
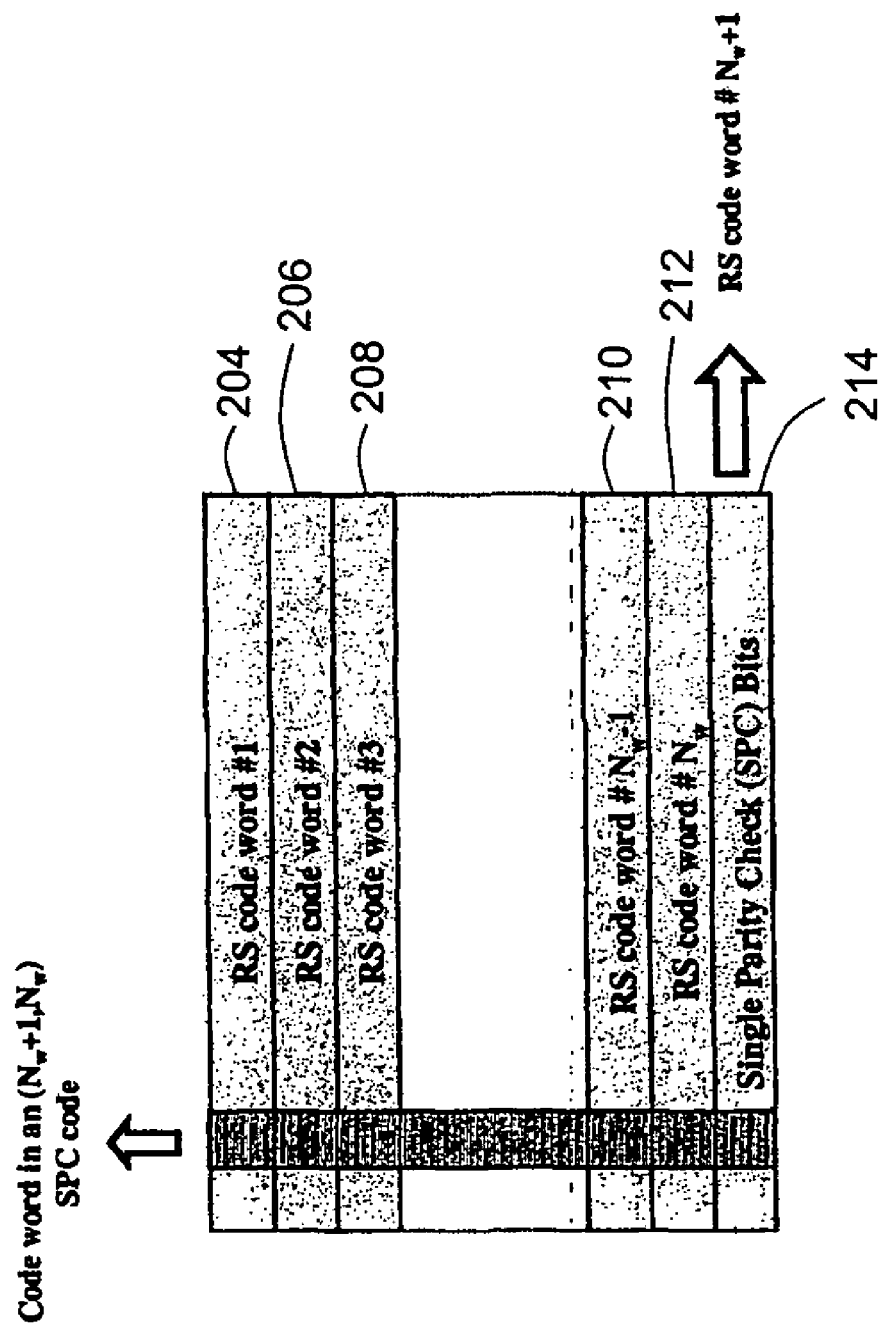
FIG. 2 illustrates an example of a two dimensional (2D) array with RS codewords as rows and SPC codewords as columns forming a Reed-Solomon/single parity check (RS/SPC) product code.

While the concept of RS/SPC 2D arrays is general, a specific example of an RS/SPC 2D array is shown in FIG. 2. Rows 204, 206, 208, 210, 212 in this two dimensional bit array are (N, K) RS codewords with symbol size m bits, and every column is a codeword in an SPC code. The array is, in fact, a product code, and it is denoted here as an RS/SPC product code. The total of $N_w$ RS codewords constitute $N_w$ rows, and one additional row 214 is formed so that each of the Nm columns satisfies the overall parity check. The data arrangement shown in FIG. 2 relates to encoding in a Reed-Solomon encoder such as RS/SPC encoder 142 in FIG. 1B.

General RS/SPC 2D Arrays

A general 2D array consisting of RS codewords and SPC bits is formed by removing the constraint that every row is an RS codeword. In other words, code bits of $N_w$ RS codewords are arranged in an $n_r \times n_c$ 2D array in a certain way. Again, one extra row is formed so that each column of an array is an SPC codeword. The parameters $n_r$ and $n_c$ have to satisfy $n_r \cdot n_c = N_w \cdot N \cdot m$, where N is an RS code length and m is the symbol size in bits.

RS code bits can be placed in an $n_r \times n_c$ array in many different ways. For example, code bits of $N_w$ RS codewords are arranged in such a way that each codeword forms several consecutive rows of a 2D array. This is convenient when RS code is long and there is a desire to avoid excess overhead with additional Nm SPC bits. Furthermore, bits of one codeword can be placed into several rows of an array in different ways too. Two main approaches can be distinguished:

(1) Bits within one symbol belong to the same row (row-wise symbol expansion)

(2) Bits within one symbol belong to the same column (column-wise symbol expansion)

Figure 3:
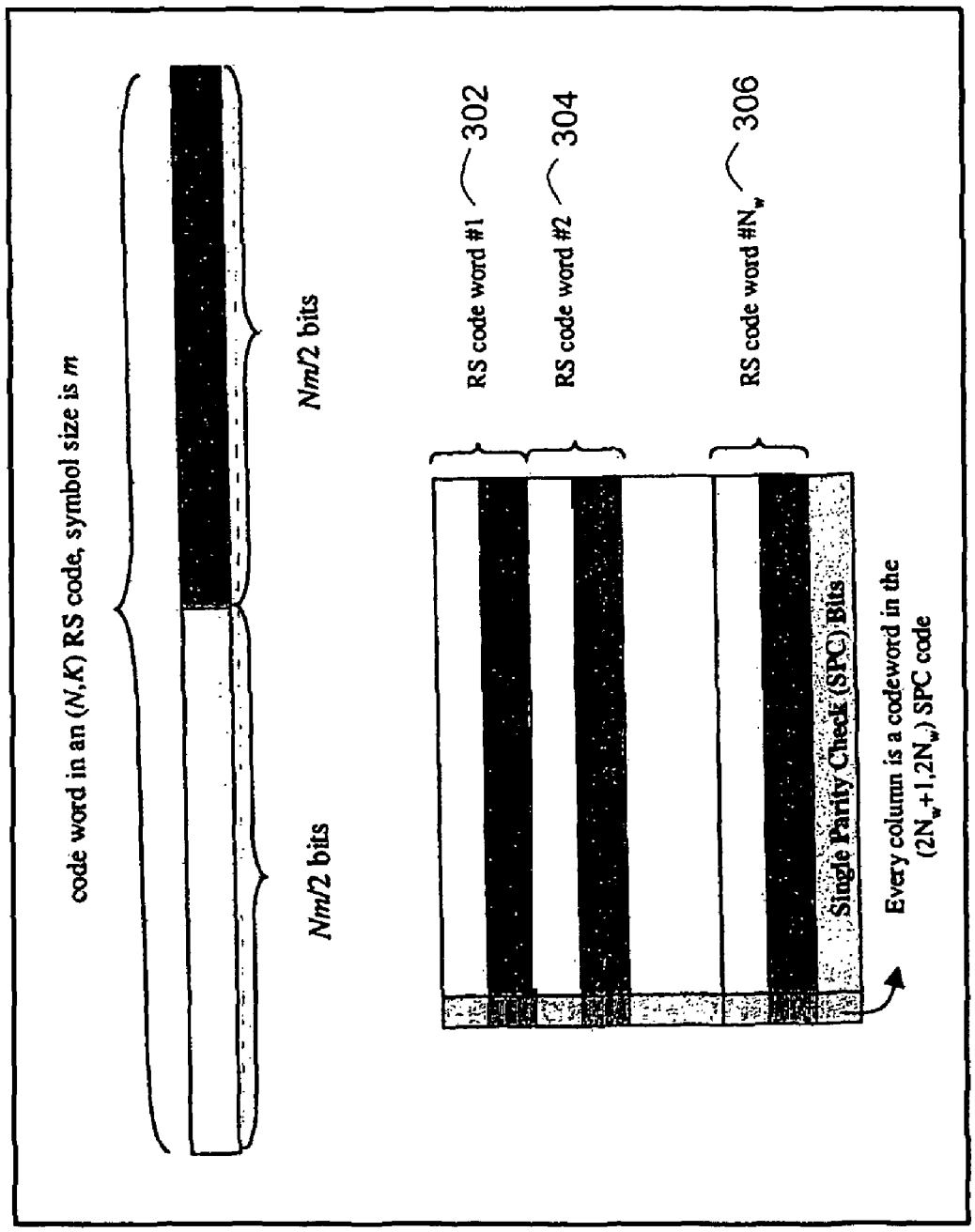
FIG. 3 illustrates an example of an RS/SPC 2D array, with two rows forming a RS codeword using a row-wise expansion of symbol bits, and SPC codeword as columns.

An example of approach (1) is shown in FIG. 3. In this example, each RS codeword 302, 304, 306 is arranged to form two rows. Note that the bits from each symbol belong to the same row of an array. Also, note that RS/SPC product code is a special case of this approach, with all code bits of one codeword forming one row. The data arrangement shown in FIG. 3 relates to encoding in a Reed-Solomon encoder such as RS/SPC encoder 142 in FIG. 1B.

Figure 4:
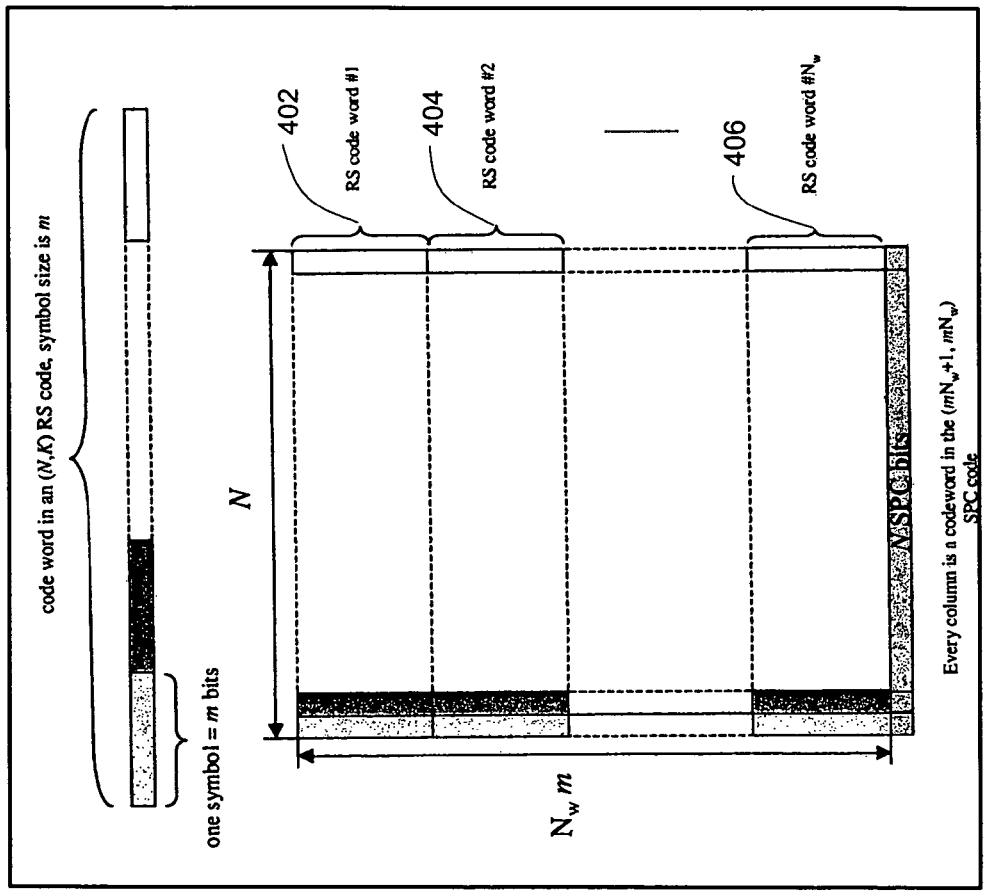
FIG. 4 illustrates an example of an RS/SPC 2D array, with m rows forming an RS codeword using a column-wise expansion of m symbol bits, and SPC codewords as columns.

In FIG. 4, an example of approach (2) is shown. In this approach, each RS codeword is forming m rows 402, 404, 406, and code bits belonging to one symbol are placed in m different consecutive rows. The data arrangement shown in FIG. 4 relates to encoding in a Reed-Solomon encoder such as RS/SPC encoder 142 in FIG. 1B. In partial response channels, this approach may incur some loss. For approach (2), channels bursts of errors are more likely to occur than random errors. With approach (2), single parities are formed on bits belonging to the same symbol. This means that bursts of errors are likely to be present in a single SPC codeword.

RS code bits can be arranged in a 2D array in many other ways (including a random arrangement). An RS/SPC array can be viewed as a concatenated code, where RS code is the outer code, and SPC code is the inner code. The encoding can be performed as follows:

1. User data bits are divided into $N_w$ segments and each segment is encoded using RS encoder.
2. Obtained $N_w$ RS codewords are arranged in a 2D array in a certain (predefined) way.
3. The SPC bits are formed on each column of an array.

Decoding Method

Below, a proposed decoding algorithm is described for an RS/SPC 2D array defined above.

It is known that any concatenated code with component codes that have simple soft decoding algorithms can be decoded iteratively. In such iterative decoding, soft bit information is updated in each component code in every iteration, and obtained soft output information is exchanged between component decoders. The decoding is called turbo decoding and it is shown to perform well. In fact, capacity approaching performance is achievable. For an RS/SPC array, however, one component code is an RS code and it does not have simple soft decoding algorithm. Nevertheless, as can be seen from the description of the proposed algorithm, the decoding can still be performed iteratively.

Soft information for any bit c is given as its log-likelihood ratio (LLR) is:

$$L(c) = \log \frac{P(c=1)}{P(c=0)}. \qquad \text{Equation 1}$$

The proposed iterative decoding can be described as follows:

Step 1. Every RS codeword in an array is decoded using conventional Berlekamp-Massey decoding algorithm. If the decoding is successful, the LLRs for decoded code bits are set to some fixed value of appropriate sign (positive for a decoded 1, negative for a decoded 0) and large magnitude. This process is called the pinning of the bit LLR. Otherwise, bit LLRs remain unchanged.

Step 2. If all RS codewords in an array have been decoded successfully, stop the decoding.

Step 3. Based on the SPC column code, new LLRs are obtained for each bit in an array.

Step 4. The LLRs of the bits in RS codewords that are not successfully decoded are replaced with new LLRs obtained in the Step 3.

Step 5. If the maximum number of iterations has not been reached, go back to the Step 1. Otherwise, stop the decoding.

Figure 5:
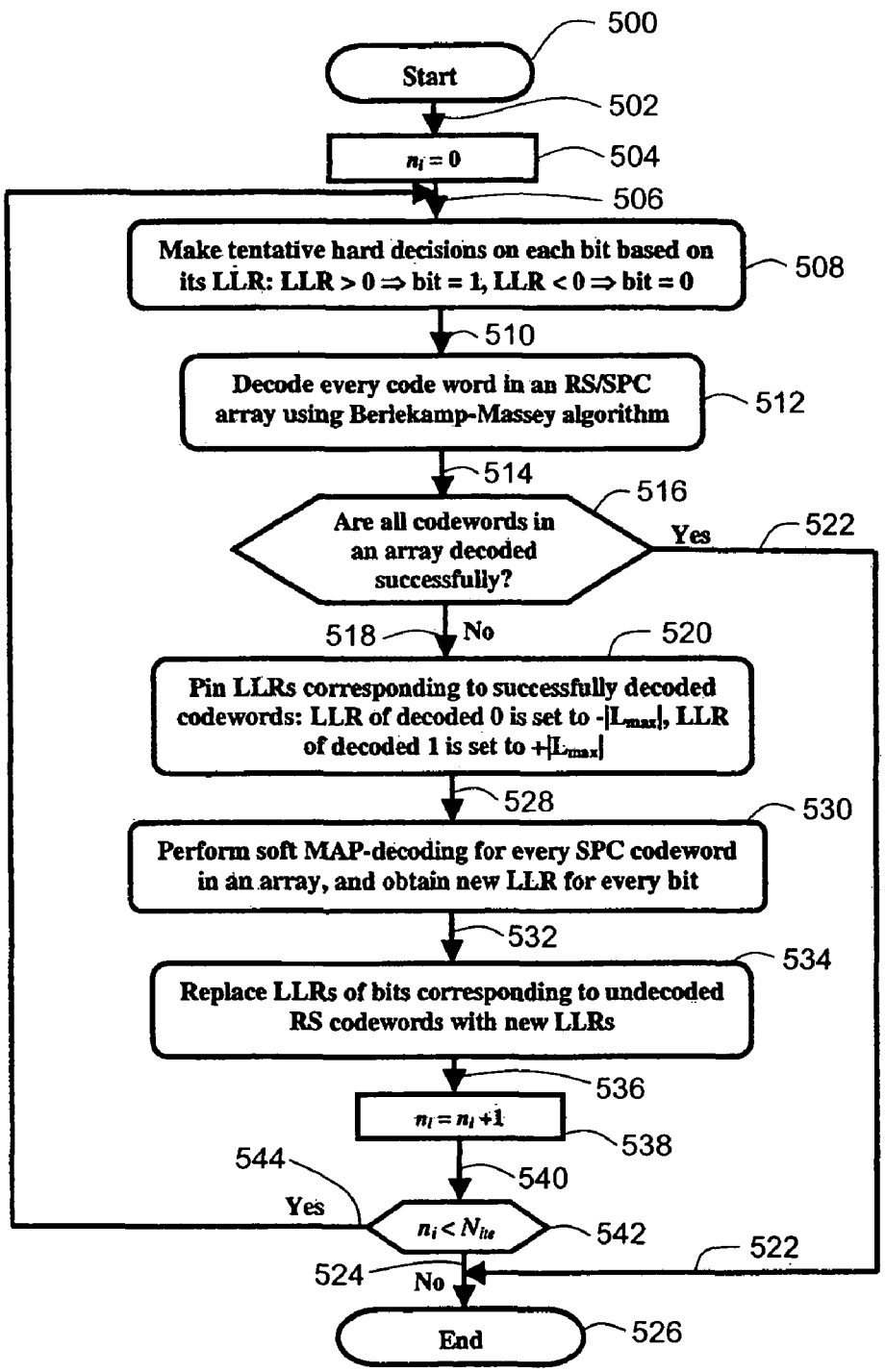
FIG. 5 illustrates a flow chart of the proposed iterative decoding for an RS/SPC array.

The flow chart of the proposed decoding algorithm is depicted in FIG. 5. The process shown in FIG. 5 relates to a decoder such as the decoder described below in connection with FIG. 7 and to RLL decoder 174/MAP decoder in FIG. 1B.

Processing starts in FIG. 5 at start 500 and continues along line 502 to action block 504. At action block 504, $n_i$ is set to zero. After completion of action block 504, processing continues along line 506 to action block 508. At action block 508, tentative hard decisions are made on each bit based on its LLR.

After completion of action block 508, processing continues along line 510 to action block 512. At action block 512, every code word in an RS/SPC array is decoded using a Berlekamp-Massey algorithm. After completion of action block 512, processing continues along line 514 to decision block 516. At decision block 516, decoding of all codewords in the array is tested to see if all codewords have been successfully decoded. If all codewords have not been successfully decoded, then processing continues along line 518 to action block 520. On the other hand, if testing at decision block 516 finds no remaining errors in the decoding process, then processing continues along line 522 and 524 to End 526.

At action block 520, LLRs corresponding to successfully decoded codewords in the array are pinned. After completion of action block 520, processing continues along line 528 to action block 530. At action block 530, soft MAP decoding is performed for every SPC codeword in the array, and a new LLR is obtained for each bit.

After completion of action block 530, processing continues along line 532 to action block 534. At action block 534, LLRs of undecoded RS codewords are replaced with new LLRs. After completion of action block 534, processing continues along line 536 to action block 538. At action block 538, $n_i$ is incremented, in other words $n_i$ is set to $n_i+1$.

After completion of action block 538, processing continues along line 540 to decision block 542. At decision block

542, if it is true that $n_i<N_{ite}$, then processing loops back along lines 544 and 506 to action block 508. At decision block 542, if it is not true that $n_i<N_{ite}$, then processing continues along line 524 to end 526.

In the Step 3, the set of new LLRs is obtained using maximum a posteriori (MAP) decoding for SPC codeword in each column. If $N_w$ RS codewords are used to form an array, each column consists of $N_w+1$ bits satisfying a parity check equation. In other words, for every column j, $1 \leq j \leq Nm$, bits in that column: $c_{1,j}, c_{2,j}, \ldots c_{N_w+1,j}$ satisfy:

$$\bigoplus_{i=1}^{N_w+1} c_{i,j} = 0, \quad \text{Equation 2}$$

where $\oplus$ denotes addition modulo 2. The exact MAP decoder corresponding to the j-th column produces the following output LLR for its i-th bit $c_{1,j}$:

$$L_{out}(c_{i,j}) = L(c_{i,j}) + 2 \cdot (-1)^{N_w+1} \tanh^{-1}\left(\prod_{l \neq i, l=1}^{N_w+1} \tanh\left(\frac{L(c_{l,j})}{2}\right)\right). \quad \text{Equation 3}$$

This equation has the following approximation convenient for implementation:

$$L_{out}(c_{i,j}) \approx \quad \text{Equation 4}$$

$$L(c_{i,j}) + (-1)^{N_w+1} \cdot \prod_{l \neq i, l=1}^{N_w+1} \text{sign}(L(c_{l,j})) \cdot \min_{l \neq i, 1 \leq l \leq N_w+1} \{|L(c_{l,j})|\}.$$

Figure 6:
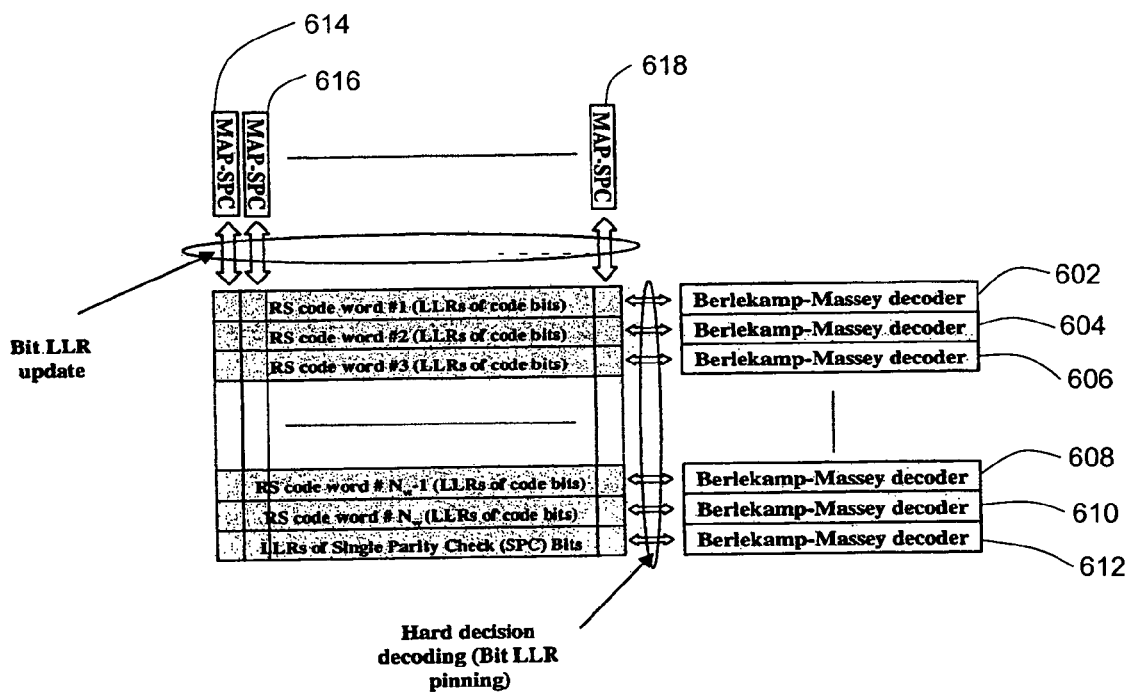
FIG. 6 illustrates a decoder for an RS/SPC product code.

An example of the proposed decoder for RS/SPC product code can be depicted as in FIG. 6. In FIG. 6, there are $N_w+1$ Berlekamp-Massey decoders 602, 604, 606, 608, 610, 612 and Nm MAP-SPC decoders 614, 616, 618. However, the decoding can be performed with only one Berlekamp-Massey and only one MAP-SPC decoder, at a cost of increased decoding delay. In that case, for all rows (columns), the row (column) update has to be performed serially instead of in parallel. Detailed block diagrams of Berlekamp-Massey decoder and reduced complexity MAP-SPC decoder are given in FIG. 7 and FIG. 8, respectively.

Figure 7:
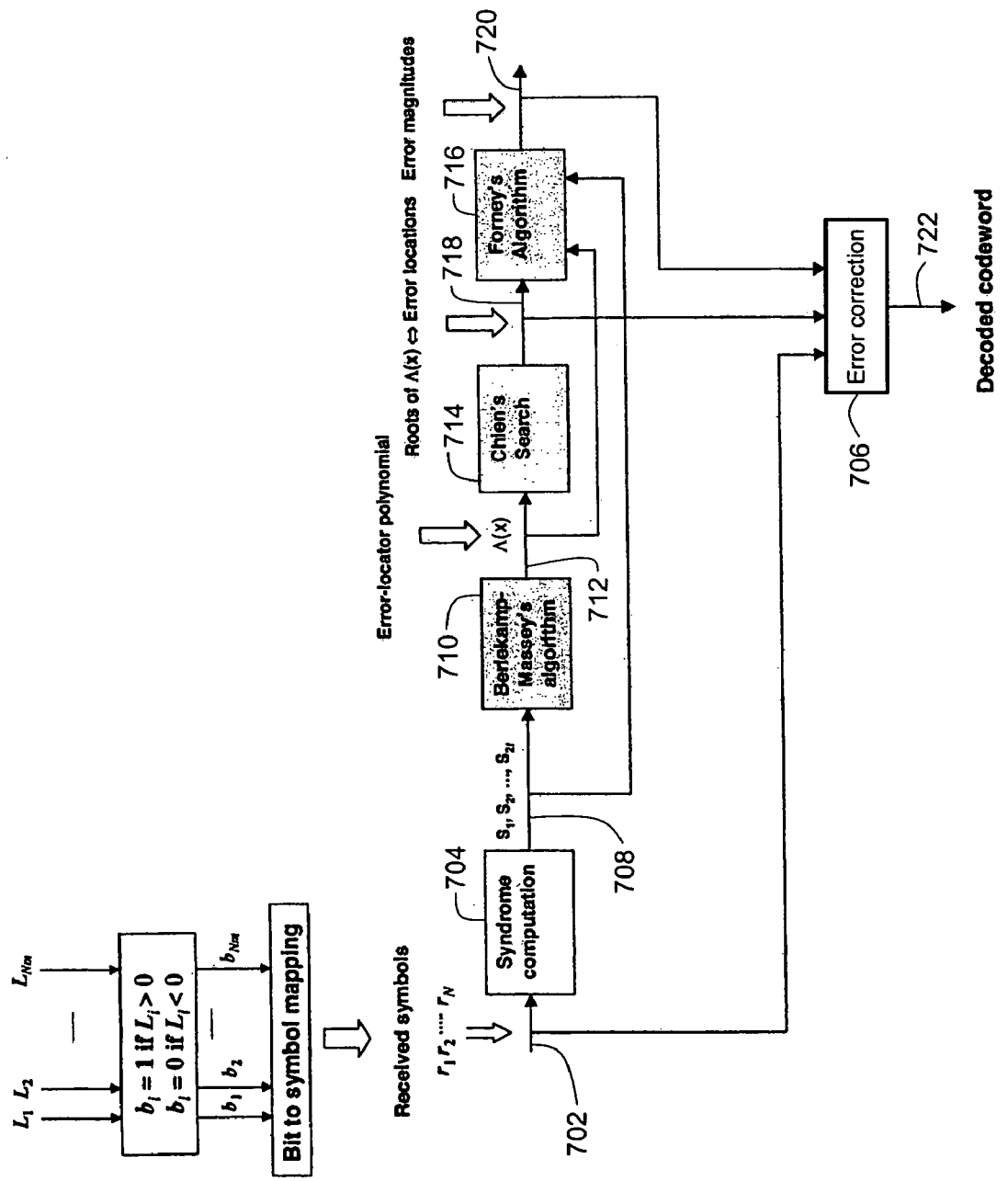
FIG. 7 illustrates a block diagram of a Berlekamp-Massey hard decision RS decoder.

In FIG. 7, received symbols on line 702 are coupled to a syndrome computation block 704 and an error correction block 706. The syndrome computation block 704 provides an output s1, s2, ... s2t at 708 to a Berlekamp-Massey's algorithm block 710 and to a Forney's algorithm block 716. The Berlekamp-Massey's algorithm block 710 provides an error locator polynomial $\Lambda(X)$ at 712 to a Chien's Search block 714 and to the Forney's algorithm block 716. The Chien's search block 716 provides roots of $\Lambda(X)$ (i.e., error locations) on line 718 to the Forney's algorithm block 716 and to the error correction block 706. The Forney's algorithm block 716 provides error magnitudes on line 720 to the error correction block 706. The error correction block 706 provides decoded codewords on line 722.

Figure 8:
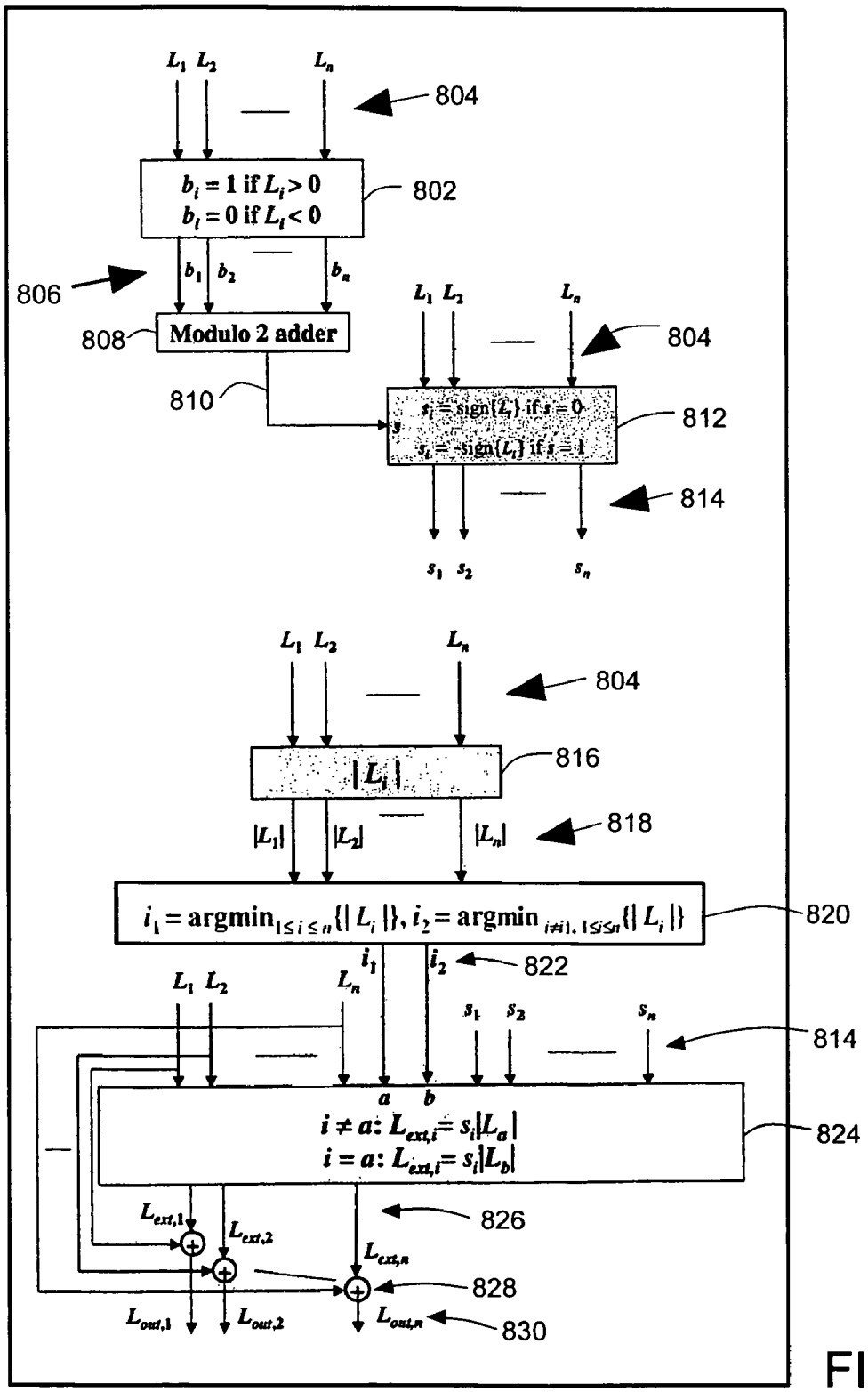
FIG. 8 illustrates a block diagram of a reduced complexity maximum a posteriori (MAP) decoder for an (n, n-1) SPC code.

FIG. 8 illustrates a reduced complexity MAP-SPC decoder for an (n, n-1) SPC code. A hard decision block 802 receives LLRs at 804. The hard decision block makes a preliminary decision on each bit based on the LLRs received at 804. The hard decision block 802 generates bits 806 that couple to modulo 2 adder 808. The modulo 2 adder provides an output 810 to sign calculation block 812. Sign calculation block 812 receives the LLRs at 804. The sign calculation block 812 provides sign output bits $s_1, s_2, \ldots s_n$ at 814.

The LLR's at 804 are also coupled to absolute value block 816. Absolute value block 816 provides absolute value outputs 818. Absolute values 818 couple to function block 820. Function block 820 calculates $i_1$ and $i_2$ at 822 according to Equations 5 and 6:

$$i_1 = \text{argmin}_{1 \leq i \leq n}\{|L_i|\} \quad \text{Equation 5}$$

$$i_2 = \text{argmin}_{i \neq i1, 1 \leq i \leq n}\{|L_i|\} \quad \text{Equation 6}$$

Outputs $i_1$ and $i_2$ at 822 couple to function block 824. Outputs 814 from block 812 couple to function block 824. LLRs at 804 also couple to function block 824. Function block 824 calculates $L_{ext,1}, L_{ext,2}, \ldots, L_{ext,n}$ at 826 according to Equations 7 and 8:

$$i \neq a: L_{ext,i} = s_i|L_a| \quad \text{Equation 7}$$

$$i = a: L_{ext,i} = s_i|L_b| \quad \text{Equation 8}$$

Outputs $L_{ext,1}, L_{ext,2}, \ldots, L_{ext,n}$ at 826 couple to adders at 828. LLRs at 804 also couple to the summing nodes 828. The summing nodes provide updated LLR outputs $L_{out,1}, L_{out,2}, \ldots L_{out,n}$ at 830.

Introduction of Erasures

Instead of using conventional error only Berlekamp-Massey decoding in the Step 1 of the proposed decoding, erasures can be introduced based on the soft bit information, and perform error/erasure decoding. This would provide further improvement in performance and faster convergence. It is assumed that an RS code with error correcting capability T has minimum distance 2T+1.

If error/erasure decoding is performed, a criteria needs to be determined for erasing a symbol. In the classical soft decoding algorithm, Forney's Generalized Minimum Distance (GMD) decoding, a received symbol sequence is decoded in T+1 attempts (assuming RS code has a minimum distance 2T+1). In the i-th attempt ($0 \leq i \leq T$), the 2i least reliable symbols are erased. This implies a search for the 2T least reliable symbols in a received symbol sequence. This search may be too complex to implement. For this reason, the following technique is used:

(a) Before the decoding, a threshold value for bit LLR magnitude, $L_T>0$, is established.

(b) Whenever a magnitude of a bit LLR is less then $L_T$, the symbol to which that bit belongs is marked for erasure.

Note that with Berlekamp-Massey decoding, a maximum of 2T erasures can be corrected. With the threshold method, the number E of symbols marked for erasure may exceed 2T. In that case, one can either perform error only decoding or keep reducing the threshold until $E \leq 2T$.

Another, more complex way to avoid a search for the least reliable symbols, and still perform a series of error/erasure RS decodings, similar as in GMD decoding, can be described as follows:

(a) Prior to the decoding, the step of an LLR magnitude threshold $\Delta L_T>0$ is determined. The counter i is set to zero. The initial LLR magnitude threshold is set to zero: $L_T^{(0)}=0$. The number of erasures in the previous decoding attempt is set to $E^{(i-1)}=E^{(-1)}=-1$.

(b) Determine the bits whose LLR magnitude is less then $L_T^{(i)}$. The symbols containing those bits are marked for erasure. If the number of such symbols $E^{(i)}$ is at most 2T and if $E^{(i)}>E^{(i-1)}$, Berlekamp-Massey error/erasure decoding is performed. If $E^{(i)}>2T$, stop the decoding.

(c) Increase the counter i:i←i+1. Update the bit LLR threshold: $L_T^{(i)} = L_T^{(i-1)} + \Delta L_T$.

Go back to (b).

For this decoding, the choice of the LLR threshold step $\Delta L_T$ is essential. If it is too large, the decoding will be error only in most cases. If it is too small, a lot of effort is wasted on increasing the LLR threshold.

Note that the more erasures are introduced, the larger the probability to decode a wrong codeword. This type of decoding error is very dangerous since the receiver is not notified of the decoding failure. For this reason, it may be desirable to specify a maximum number of allowed erasures, $E_{max}$ ($E_{max} \leq 2T$).

Figure 9:
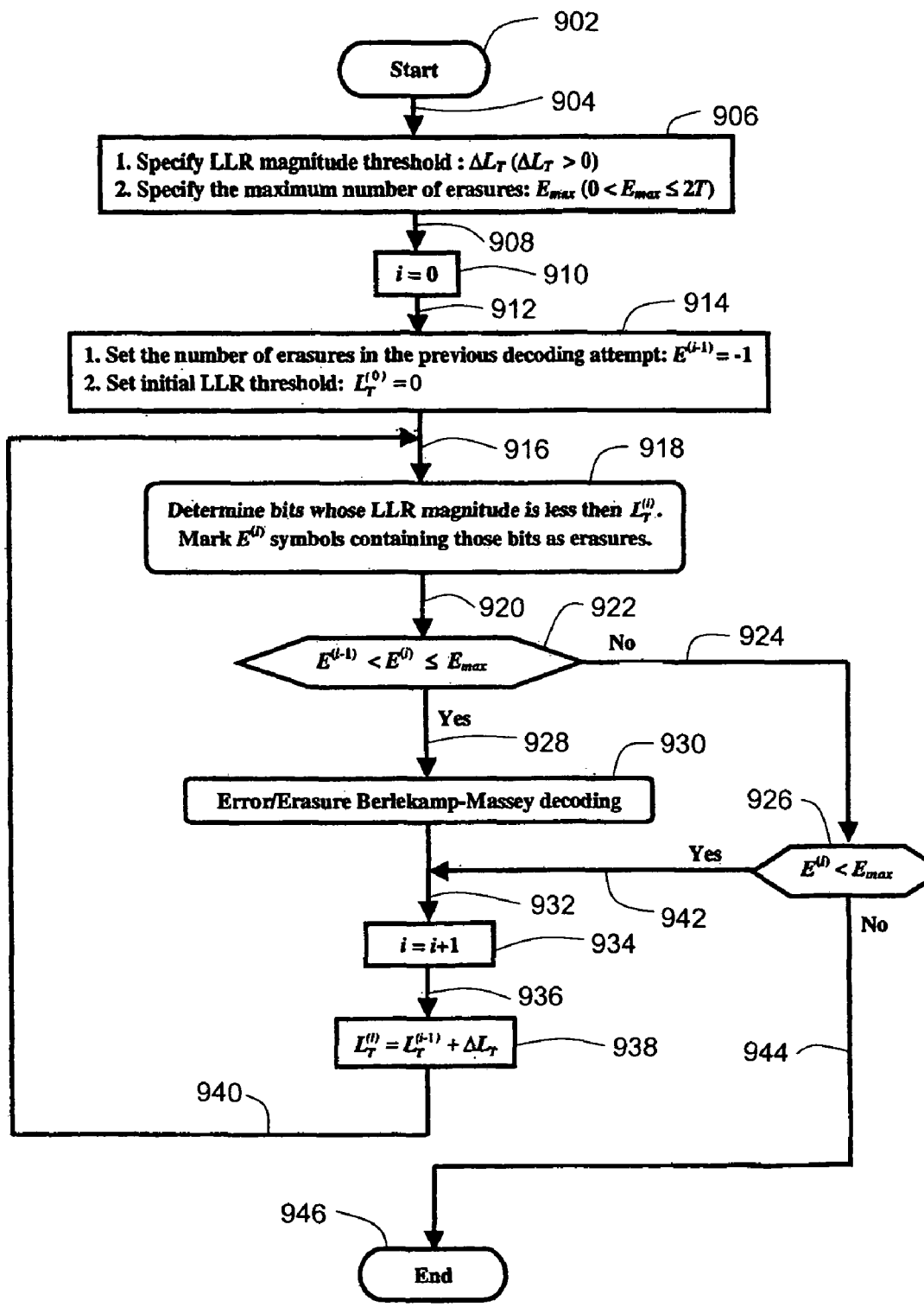
FIG. 9 illustrates a flow chart of the algorithm that performs error/erasure RS decodings in steps, with the number of erasures increasing in each step. The decoding mimics generalized minimum distance (GMD) decoding without sorting log likelihood ratios (LLR's). The closeness to the actual GMD decoding depends on the chosen value of LLR magnitude threshold step $\Delta L_T$.

A flow chart of the proposed GMD-like decoding process that avoids sorting LLRs is shown in FIG. 9. The process starts at start 902 and continues along line 904 to action block 906. At action block 906, an LLR magnitude threshold and a maximum number of erasures are specified. After completion of action block 906, processing continues along line 908 to action block 910. At action block 910, i is set to zero. After completion of action block 910, processing continues along line 912 to action block 914.

At action block 914, a number of erasures in the previous decoding attempt is set and an initial LLR threshold is set. After completion of action block 914, processing continues along line 916 to action block 918. At action block 918, the bits whose LLR magnitude is less than a threshold are determined, and an initial LLR threshold is set.

After completion of action block 918, processing continues along line 920 to decision block 922. At decision block 922, $E^{(i)}$ is tested to see if it lies within limits $E^{(i-1)}$ and $E_{max}$. If $E^{(i)}$ does not lie with these limits, then processing continues along line 924 to decision block 926. If $E^{(i)}$ does lie with these limits, then processing continues along line 928 to action block 930. At action block 930, Berlekamp-Massey decoding of errors/erasures is performed. After completion of action block 930, processing continues long line 932 to action block 934.

At action block 934, i is incremented, or in other words i is set to i+1. After completion of action block 934, processing continues along line 936 to action block 938. At action block 938, $L_T^{(i)}$ is set to $L_T^{(i-1)} + \Delta L_T$. After completion of action block 938, processing continues along lines 940 and 916 to action block 918.

At decision block 926, $E^{(i)}$ is tested to see if it is less than $E_{max}$. If $E^{(i)}$ is less than $E_{max}$ at decision block 926, then processing continues along lines 942 and 932 to action block 934. If $E^{(i)}$ is not less than $E_{max}$ at decision block 926, then processing continues along line 944 to end 946.

Decoding Parameters

From the description of the proposed decoding algorithm, it can be seen that there are several parameters that need to be specified prior to the decoding. First, in the Step 1 of the decoding, the LLRs of code bits in successfully decoded RS codewords are set to a value of large magnitude with appropriate sign. This large magnitude $L_{max}$ has to be defined prior to the decoding. The second parameter is the maximum number of iterations, $N_{ite}$. Furthermore, if erasure/error decoding is performed, the LLR magnitude threshold $L_T$ needs to be specified and also the maximum number of allowed erasures $E_{max}$. Finally, in order to perform GMD-like decoding by using threshold which is increased in discrete steps, the threshold step $\Delta L_T$ need to be specified.

To determine the set of decoding parameters, the best solution would be to perform optimization of these parameters. However, this is a very complex problem. On the other hand, all the parameters can be determined by performing different trials in simulations, and choosing the set of parameters that provides the best performance.

To summarize, the list of decoding parameters is:
- Maximum LLR magnitude, $L_{max}$,
- Maximum number of iterations, $N_{ite}$,
- LLR magnitude threshold, $L_T$, or LLR magnitude threshold step, $\Delta L_T$, and
- Maximum number of erasures, $E_{max}$.

Decoding Complexity

In each iteration, the proposed decoding algorithm for an $n_r \times n_c$ array consisting of $N_w$ RS codewords performs:
- Berlekamp-Massey decoding, $N_w$ times, and
- MAP-SPC decoding, $n_c$ times.

It is assumed that a reduced complexity MAP-SPC is used. Commonly, the decoding complexity is expressed as the total number of required multiplications. Since reduced complexity MAP-SPC involves only determining the minimum over all bit LLR magnitudes, it does not include any multiplications. Therefore, the overall complexity of the proposed algorithm is:

$$C \approx N_{ite} \cdot N_w \cdot C_{BM}(N,T,m), \quad \text{Equation 9}$$

where $C_{BM}(N, T, m)$ denotes the computational complexity of Berlekamp-Massey decoding of RS code of length N, symbol size m, and error correcting capability T. Consequently, the decoding complexity of the proposed algorithm can be considered to be approximately $N_{ite}$, times larger then the complexity of the conventional Berlekamp-Massey decoding for the same number of RS codewords. Note, however, that the memory requirements and the decoding delay for the proposed algorithm are substantially larger.

If instead of error only hard decision decoding, error/erasure decoding is performed, the Berlekamp-Massey algorithm is performed at most 2T+1 times for each RS codeword, and the following upper bound on the complexity results:

$$C \leq (2T+1) \cdot N_{ite} \cdot N_w \cdot C_{BM}(N,T,m). \quad \text{Equation 10}$$

Simulation Results

Below, a set of simulation results is provided for the WFR performance with the proposed decoding method. As a running example, a shortened RS code over a finite Galois Field $GF(2^{10})$ with K=410 information symbols is considered. An RS code symbol consists of m=10 bits. The error correcting capability is T=20 and code length is N=K+2T=450. No interleaving of RS codewords is performed. The number of codewords within RS/SPC array, is $N_w$=64. Thus, every column in an array of FIG. 2 is a codeword in the (65,64) SPC code. A perpendicular recording channel with the channel response equalized to a partial response target PR2=[1,2,1] is considered. The user bit density is $D_u$=2.0, while the normalized channel bit density nD is adjusted according to the overall code rate $$R = \frac{K}{N} \cdot \frac{N_w}{N_w + 1},$$

nD=$D_u$/R. In all simulations the maximal bit LLR magnitude is set to $L_{max}$=15.

Figure 10:
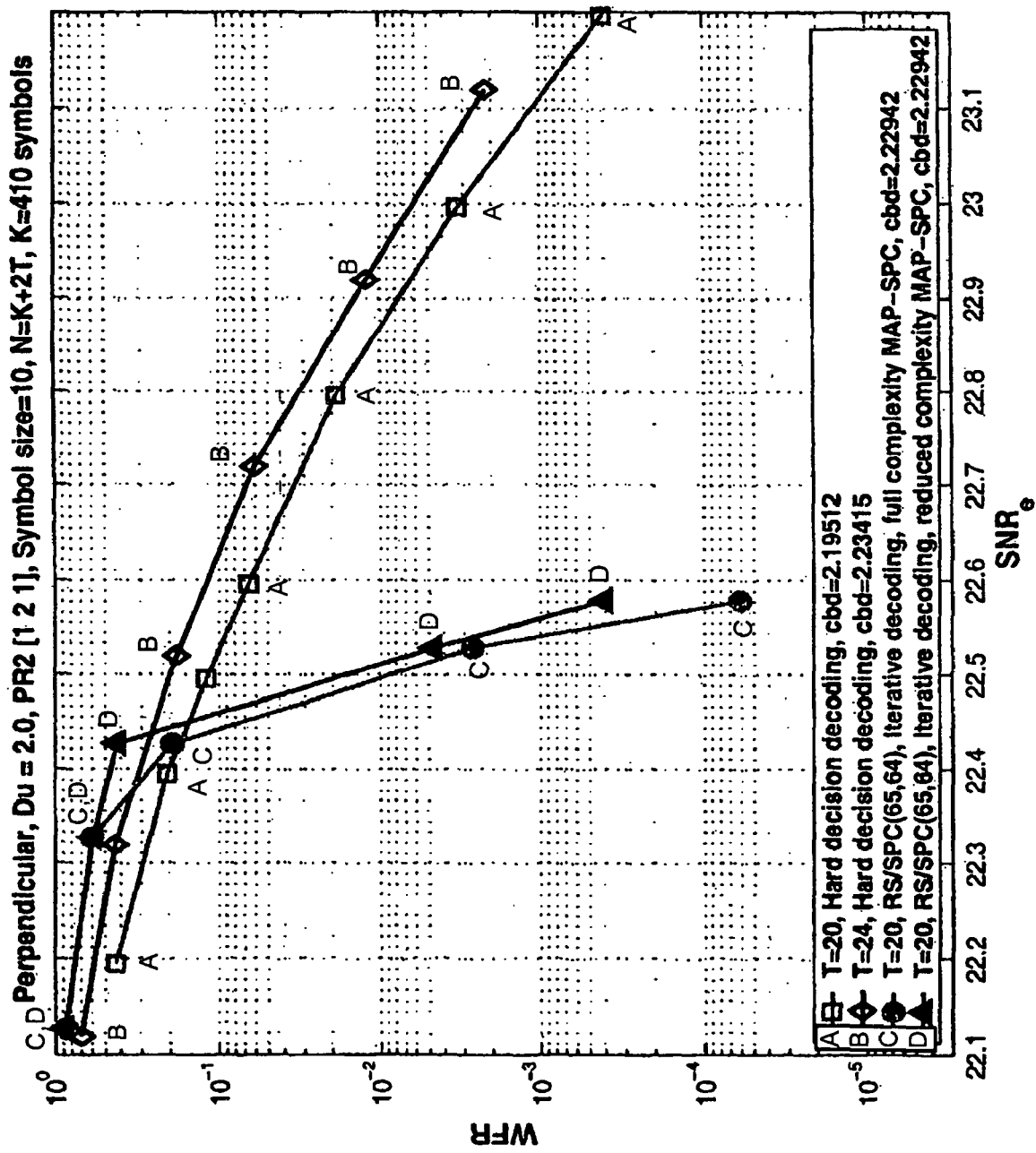
FIG. 10 illustrates word failure rate (WFR) performance of a 2D array comprising RS codewords as rows and SPC codewords as columns (RS/SPC product code) with the proposed iterative decoding for perpendicular recording channel, electronics noise only.

The performance of the RS/SPC array with the proposed iterative decoding over a channel with no media noise is shown in FIG. 10. For detection a BCJR algorithm is used which maximizes bit a posteriori probability. Both the performance with reduced and full complexity MAP for SPC column codes is simulated. The performance loss due to a more realistic reduced complexity MAP for SPC code is very small in terms of SNR. With the maximal number of iterations set to $N_{ite}$=10, the gain of iterative decoding of an RS/SPC array compared to the conventional RS decoding is large. From FIG. 10 it can be seen that at the WFR of $\approx 10^{-4}$, the obtained gain is at least 0.65 dB. Also, at the SNR $\approx$22.6, the WFR of the proposed decoding scheme is as small as $3 \cdot 10^{-5}$ for full complexity SPC-MAP, and $3 \cdot 10^{-4}$ for reduced complexity SPC-MAP, whereas conventional decoding provides WFR of 0.05. Also, in FIG. 10 the performance of the RS code is included with the conventional decoder but for increased error correcting capability, T=24. This T is chosen so that the overall rate is approximately the same as the overall rate of the analyzed RS/SPC array. If the total overhead is increased by simply increasing the error correcting capability of an RS code, the performance degrades.

Figure 11:
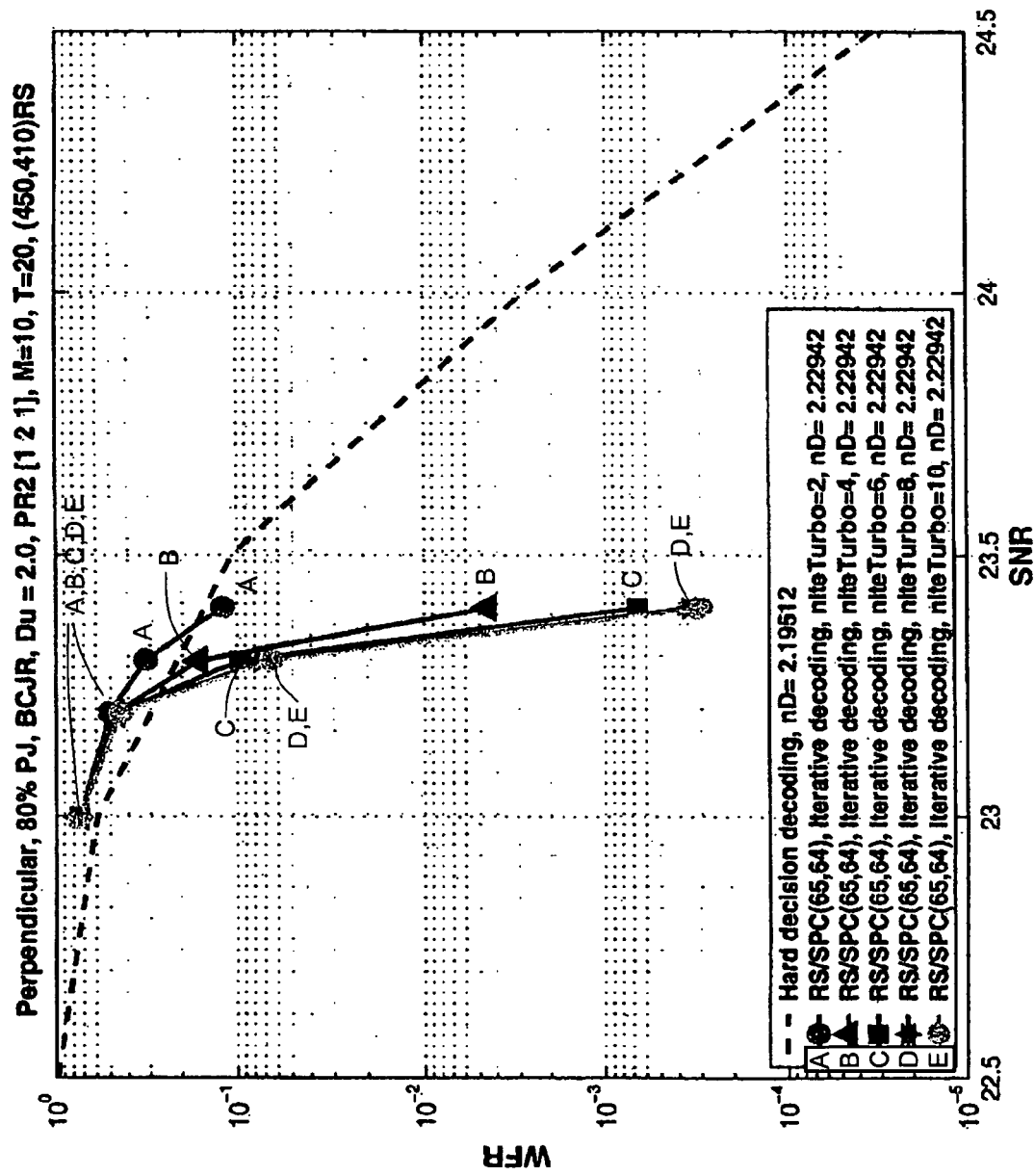
FIG. 11 illustrates WFR performance of a 2D array comprising RS codewords as rows and SPC codewords as columns (RS/SPC product code) with the proposed iterative decoding for perpendicular recording channel, 80/20 media/electronic noise mixture.
Figure 12:
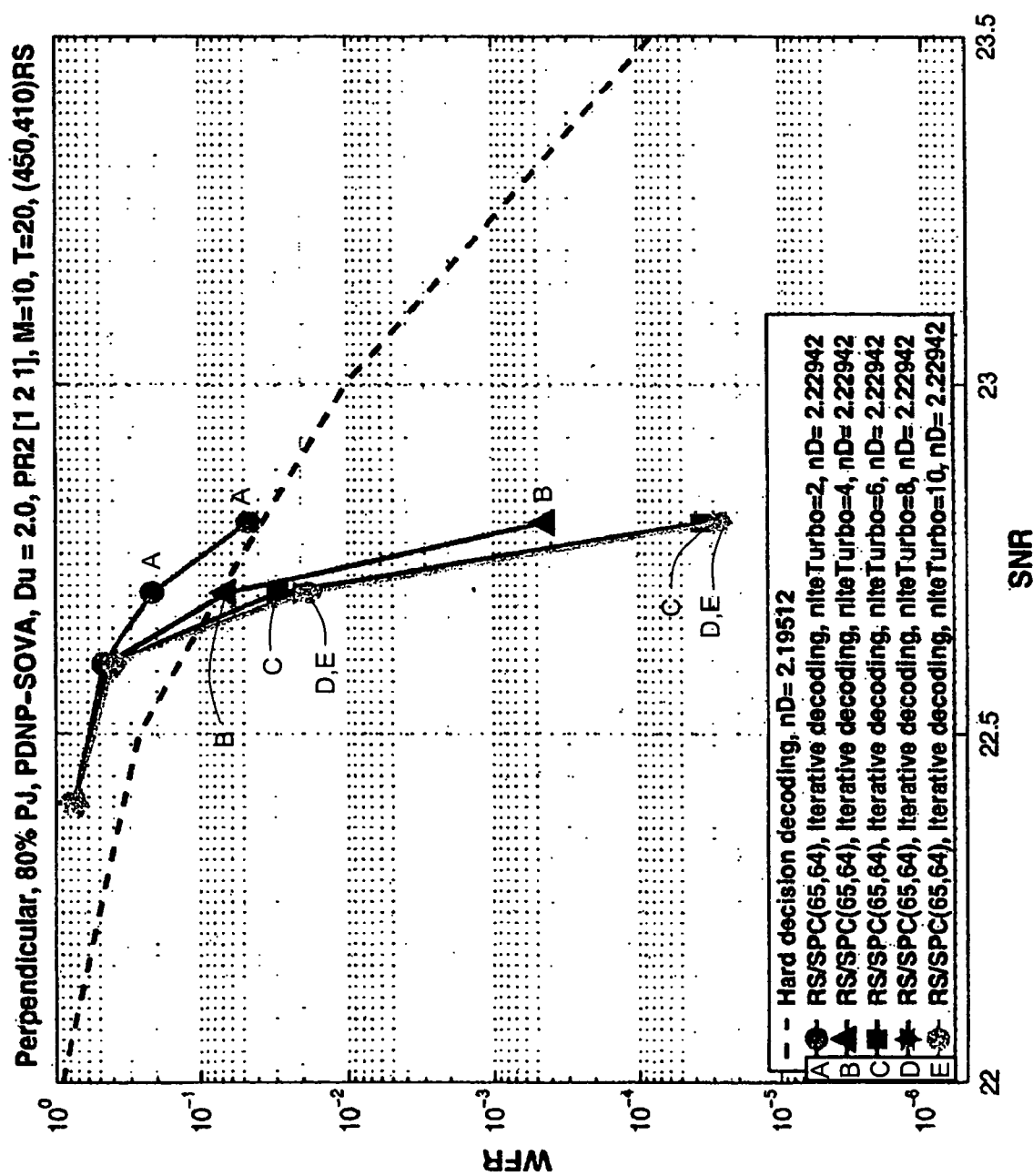
FIG. 12 illustrates WFR performance of a 2D array comprising RS codewords as rows and SPC codewords as columns (RS/SPC product code) with the proposed iterative decoding for perpendicular recording channel, 80/20 media/electronic noise mixture. The detection is performed with a pattern dependent noise predictive soft output Viterbi algorithm (PDNP-SOVA).

In FIGS. 11-12, the noise mixture of 80% position jitter and 20% electronics noise are considered.

In FIG. 11, a BCJR detector is used, whereas in FIG. 12 Pattern Dependent Noise-Predictive Soft-Output Viterbi Algorithm (PDNP-SOVA) was used. FIGS. 11-12 also show the convergence with the number of iterations. The decoding converges only after 4-6 iterations.

Figure 13:
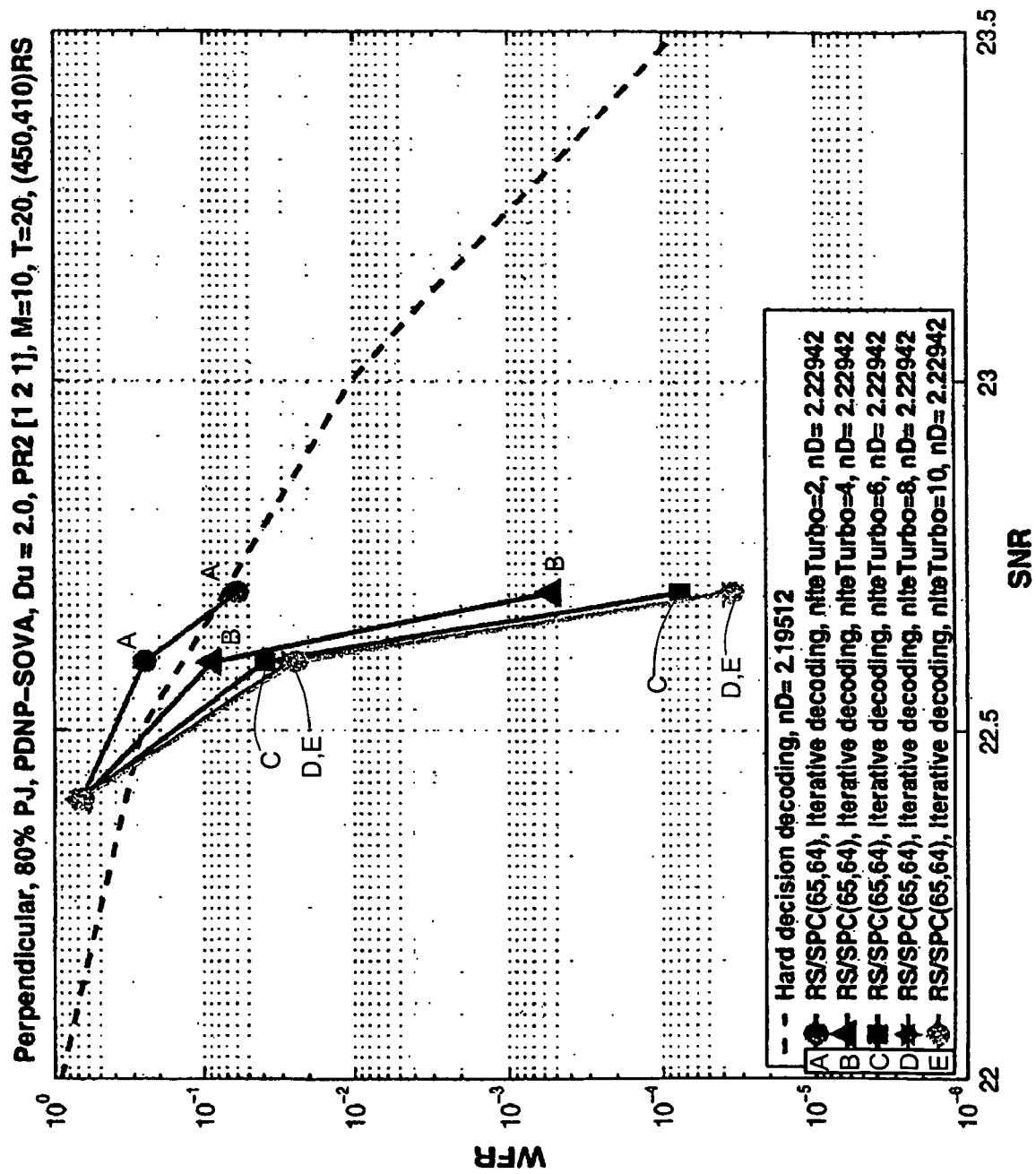
FIG. 13 illustrates WFR performance of a 2D array comprising RS codewords as rows and SPC codewords as columns (RS/SPC product code) with the proposed iterative decoding for perpendicular recording channel, 80/20 media/electronic noise mixture. The detection is performed with PDNP-SOVA and decoding is enhanced with erasure decoding.

Finally, in FIG. 13, the performance in the system with 80% position jitter and 20% electronics noise and PDNP-SOVA detector is shown. During the iterative decoding erasure/error decoding is used instead of the error only Berlekamp-Massey decoding. The positions of erasures are determined using a series of thresholds on the bit LLR magnitudes. In this example, the LLR magnitude threshold step is $\Delta L_T$=0.01 and the maximum number of allowed erasures is set to $E_{max}$=T.

Sector Size and Applications of the Iterative Decoding of RS/SPC 2D Arrays

In summary, an RS/SPC 2D array structure and its iterative decoding for error correction is disclosed. The improvement in performance was measured in terms of improved WFR. However, in storage systems, a sector size is an important parameter and the Sector Failure Rate (SFR) represents one of the ultimate performance metrics. If one sector consists of c codewords, the following inequalities hold:

$$WFR \leq SFR \leq c \cdot WFR$$

As far as the proposed RS/SPC 2D array is concerned, it can consist of an arbitrary number of sectors. For example, in the presented simulation results 64 codewords in the shortened (450,410) RS code over GF($2^{10}$) were used to form one RS/SPC array. These 64 codewords may in fact be 64 separate sectors (in which case WFR=SFR) or there can be a larger number of codewords within one sector.

If the whole array is a single sector, the proposed 2D array can be regarded as a single error correction code and the proposed decoding method can be used for error correction in the storage systems. However, to obtain good performance, the proposed scheme requires strong RS codes. This means that RS code within RS/SPC array should be relatively long, and the whole array may be prohibitively large to form a single sector. On the other hand, if an RS/SPC array consists of a number of sectors, the proposed decoding method may be used as a recovery measure, after other decoding and recovery procedures fail.

In some of the existing Redundant Arrays of Inexpensive Discs (RAID) architectures, a single parity disc is added for data protection. The bits on this disc are formed by adding bits on data discs modulo 2. Using hard decisions, only one disc failure can be tolerated. However, with bit LLRs available, and having in mind the fact that RS/SPC arrays are inherently present when such parity disc is formed, the proposed iterative decoding can be used, and a significantly larger number of failures can be recovered from.

RS/SPC Multidimensional Arrays

The concept of RS/SPC 2D arrays can be extended to arbitrary number d of dimensions in a straightforward way. First, an RS code bits are placed into an $n_1 \times n_2 \times \ldots \times n_d$ array. Then, single parity check bits are added in arbitrary d−1 dimensions.

Figure 14:
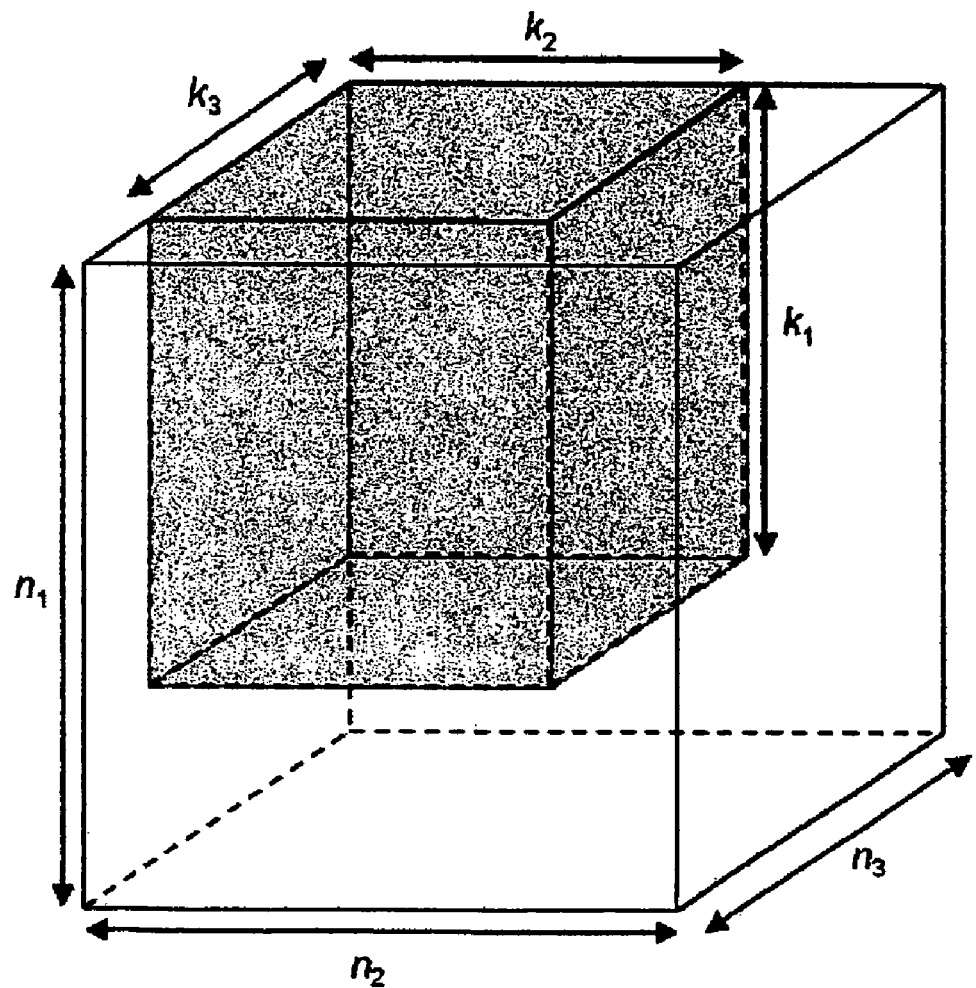
FIG. 14 illustrates an example of a 3D RS/SPC array: 3-dimensional product code RSxSPCxSPC.

A simple example of RS/SPC 3D array is given in FIG. 14. The array in this example is, in fact, a 3D product code: RS×SPC×SPC. Therefore, there are ($n_1$, $k_1$) RS codewords in the first dimension, ($n_2$, $k_2$) SPC codewords in the second dimension, and ($n_3$, $k_3$) SPC codewords in the third dimension. Clearly, $n_2=k_2+1$, $n_3=k_3+1$, $n_1$=Nm, and $k_1$=(N−2T)m. To obtain a more general 3D RS/SPC array, RS code bits can be arbitrarily arranged in an $n_1 \times k_2 \times k_3$ 3D array, and then SPC bits can be added in the second and third dimension. The decoding remains as shown in FIG. 5. The flow chart applies to any number of dimensions.

Furthermore, this kind of concatenation between one strong code and one weak code, and its decoding that iteratively performs hard decision decoding of the strong component code and LLR update via the weak component code soft decision decoder, can be generalized to other types of component codes. There is no restriction to RS and SPC codes.

With increasing requirements for areal density on one hand, and reliability on the other, the demand for new error correction solutions that would improve reliability grows in today's storage systems. Reed-Solomon (RS) codes are very powerful codes conventionally used for error correction. In order to improve the performance of RS codes, adding redundancy does not provide a good solution. In fact, after a certain point, it degrades the performance. Another solution would be to increase RS code symbol size and RS code length; but this solution also has its practical limits.

An array and decoding algorithm for error correction are described here. If the proposed array is two dimensional, it is called RS/SPC 2D array, and it consists of RS codewords with an extra row of single parity check (SPC) bits formed on every column. If every row represents one RS codeword, the array is also a well known product code of RS and SPC code. However, the arrangement of RS codewords within this array can be more general. Furthermore, the array can be extended in a natural way to more than two dimensions. The proposed iterative decoding algorithm for an RS/SPC array can provide significant improvement of word failure rate (WFR) performance in only several iterations. The algorithm combines hard decision decoding for a powerful RS code and soft bit information update via maximum a posteriori (MAP) decoding for an SPC code. The conventional error only RS decoding can be replaced with error and erasure RS decoding for further improvement in performance. The complexity of the proposed decoding is the number of iterations times larger then the complexity of the conventional Berlekamp-Massey decoder. The improvements of WFR are demonstrated in simulation results. Also, possible applications of the proposed error correction method are discussed and the issues of a sector size and sector failure rate (SFR) computation are addressed.

An iterative soft input decoding algorithm (or iterative soft input decoding method) for the Reed-Solomon/SPC multidimensional array combines maximum a posteriori decoding of single-parity-check code words and soft value update for each bit with hard decision decoding for Reed-Solomon code words. The algorithm can include error/erasure decoding for Reed-Solomon codes words. Erasures are introduced using threshold on the LLR magnitudes of the bits. A number of decoding attempts are made for each Reed-Solomon code word, where in each attempt the LLR threshold is increased by an LLR step value.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the communication channel while maintaining substantially the same functionality without departing from the scope and spirit of the present invention. In addition, although the preferred embodiment described herein is directed to a communication channel for a data storage system, it will be appreciated by those skilled in the art that the teachings of the present invention can be applied to other binary saturated communication channels, without departing from the scope and spirit of the present invention.

What is claimed is:

1. A communication channel, comprising:
   a Reed-Solomon/parity check encoder receiving user words and generating an encoded block that includes parity check code words and Reed-Solomon code words that are recorded as sequential bits in two opposite directions on a storage medium;
   a read/write head that produces read output pulses responsive to a direction change between sequential bits;
   a soft input soft output detector receiving the read output pulses and providing a detector hard output and a detector soft levels; and
   a Reed-Solomon parity check decoder receiving the hard output and the soft levels, and generating recovered user words.

2. The communication channel of claim 1 further comprising a run-length limited encoder, and a run-length limited decoder.

3. The communication channel of claim 1 wherein the soft levels comprise log likelihood ratios.

4. The communication channel of claim 1 further comprising a maximum a posteriori decoder generating the soft levels.

5. The communication channel of claim 1 wherein the detector comprises an iterative decoder.

6. The communication channel of claim 1 wherein the detector comprises a Viterbi detector.

7. The communication channel of claim 1 further comprising an error syndrome calculation block that provides a syndrome output, and a Berlekamp-Massey algorithm block that receives the syndrome output and provides a Berlekamp-Massey error location polynomial.

8. The communication channel of claim 7 further comprising a Chien's search calculation block that receives the Berlekamp-Massey error location polynomial and provides a Chien's search error location output.

9. The communication channel of claim 8 further comprising a Forney's Algorithm calculation block that receives the Chien's search error location output and provides a Forney's error magnitude output.

10. The communication channel of claim 9 further comprising an error correction circuit providing decoded codewords, and wherein the syndrome output, the Chien's search error location output and the Forney's error magnitude output are coupled to the error correction circuit.

11. A communication channel, comprising:
    a Reed-Solomon encoder receiving user words and generating an encoded block that is recorded as sequential bits in two opposite directions on a storage medium and that includes parity check code and multiple Reed-Solomon code words, wherein each Reed-Solomon code word comprises more than one user word;
    a read/write head that produces read output pulses responsive to a direction change between sequential bits;
    a detector receiving the read output pulses and providing hard output and soft levels related to the encoded block; and
    a decoder receiving the hard output and the soft levels, the decoder generating recovered user words as a function of Reed-Solomon decoding and parity check error correction.

12. The communication channel of claim 11 further comprising an error syndrome calculation block that provides a syndrome output, and a Berlekamp-Massey algorithm block that receives the syndrome output and provides a Berlekamp-Massey error location polynomial.

13. The communication channel of claim 12 further comprising a Chien's search calculation block that receives the Berlekamp-Massey error location polynomial and provides a Chien's search error location output.

14. The communication channel of claim 13 further comprising a Forney's Algorithm calculation block that receives the Chien's search error location output and provides a Forney's error magnitude output.

15. The communication channel of claim 14 further comprising an error correction circuit providing decoded codewords, and wherein the syndrome output, the Chien's search error location output and the Forney's error magnitude output are coupled to the error correction circuit.

16. A decoder, comprising:
    a soft-input-soft-output detector receiving read output pulses from a read/write head responsive to a direction change between sequential bits stored on a storage medium, and providing a hard output and soft levels related to the encoded block;
    a DC free decoder receiving the hard output and the soft levels, the DC free decoder generating soft bit level information; and
    a Reed-Solomon parity check decoder receiving the soft bit level information and generating recovered user words.

17. The decoder of claim 16 further comprising:
    providing the soft bit level information as log likelihood ratios.

18. The decoder of claim 16 wherein the DC free decoder comprises a run length limited decoder.

19. The decoder of claim 16 wherein the soft-input-soft-output detector comprises a Viterbi algorithm.

20. The decoder of claim 16 wherein the soft-input-soft-output detector comprises a maximum a posteriori algorithm.

* * * * *